US008440324B2

(12) United States Patent
Radu et al.

(10) Patent No.: US 8,440,324 B2
(45) Date of Patent: May 14, 2013

(54) COMPOSITIONS COMPRISING NOVEL COPOLYMERS AND ELECTRONIC DEVICES MADE WITH SUCH COMPOSITIONS

(75) Inventors: Nora Sabina Radu, Landenberg, PA (US); Frederick P. Gentry, Bear, DE (US); Gene M. Rossi, Wilmington, DE (US); Gary A. Johansson, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 949 days.

(21) Appl. No.: 11/643,156

(22) Filed: Dec. 21, 2006

(65) Prior Publication Data

US 2007/0228364 A1 Oct. 4, 2007

Related U.S. Application Data

(60) Provisional application No. 60/754,962, filed on Dec. 27, 2005.

(51) Int. Cl.
*H01L 51/54* (2006.01)
*C09K 11/06* (2006.01)

(52) U.S. Cl.
USPC .......................... 428/690; 428/917; 313/504

(58) Field of Classification Search ........................ None
See application file for complete search history.

(56) References Cited

U.S. PATENT DOCUMENTS

| | | | |
|---|---|---|---|
| 5,728,801 A | 3/1998 | Wu et al. | |
| 5,817,739 A | 10/1998 | Nukada | 528/292 |
| 5,962,631 A | 10/1999 | Woo et al. | |
| 6,259,202 B1 | 7/2001 | Sturm et al. | |
| 6,277,504 B1 | 8/2001 | Koch et al. | |
| 6,287,713 B1 | 9/2001 | Heuer et al. | |
| 6,294,273 B1 | 9/2001 | Heuer et al. | |
| 6,303,238 B1 | 10/2001 | Thompson et al. | |
| 6,316,130 B1 | 11/2001 | Heuer et al. | |
| 6,322,908 B1 | 11/2001 | Oda et al. | |
| 6,368,731 B1 | 4/2002 | Heuer et al. | |
| 6,503,643 B1 | 1/2003 | Heuer et al. | |
| 6,534,200 B1 | 3/2003 | Heuer et al. | |
| 6,541,128 B2 | 4/2003 | Wehrmann et al. | |
| 6,646,164 B2 * | 11/2003 | Uemura et al. | 564/429 |
| 6,800,722 B2 | 10/2004 | Pei | |
| 6,830,832 B2 | 12/2004 | Oguma | 428/690 |
| 6,852,355 B2 | 2/2005 | Blanchet-Fincher | 427/50 |
| 6,872,475 B2 | 3/2005 | Chen et al. | |
| 6,953,705 B2 | 10/2005 | Prakash | |
| 7,023,013 B2 | 4/2006 | Ricks et al. | |
| 7,235,420 B2 | 6/2007 | Prakash et al. | |
| 7,771,843 B2 | 8/2010 | Suh et al. | |
| 2001/0019782 A1 | 9/2001 | Igarashi et al. | |
| 2002/0155319 A1 | 10/2002 | Kawamura et al. | |
| 2004/0029133 A1 | 2/2004 | Herrnstadt | |
| 2004/0082250 A1 | 4/2004 | Haoto | |
| 2004/0102577 A1 | 5/2004 | Hsu et al. | |
| 2004/0127637 A1 | 7/2004 | Hsu et al. | |
| 2004/0254297 A1 | 12/2004 | Hsu et al. | |
| 2005/0064237 A1 | 3/2005 | Kato et al. | |
| 2005/0073249 A1 | 4/2005 | Morii et al. | |
| 2005/0184287 A1 | 8/2005 | Herron et al. | |
| 2005/0186106 A1 | 8/2005 | Li et al. | |
| 2005/0205860 A1 | 9/2005 | Hsu et al. | |
| 2005/0260448 A1 | 11/2005 | Lin et al. | |
| 2006/0033421 A1 | 2/2006 | Matsuura et al. | |
| 2006/0063852 A1 | 3/2006 | Iwata et al. | |
| 2007/0031588 A1 | 2/2007 | Nakayama | |
| 2007/0032632 A1 | 2/2007 | Tsukioka et al. | |
| 2007/0181847 A1 | 8/2007 | Kuroda et al. | |
| 2008/0071049 A1 | 3/2008 | Radu et al. | |
| 2009/0206327 A1 | 8/2009 | Radu et al. | |
| 2010/0108989 A1 | 5/2010 | Büsing et al. | |
| 2010/0187506 A1 | 7/2010 | Park et al. | |
| 2011/0095269 A1 | 4/2011 | Zhang et al. | |

FOREIGN PATENT DOCUMENTS

| | | |
|---|---|---|
| DE | 102004020046 A1 | 7/2005 |
| EP | 650955 A1 | 8/1998 |
| EP | 1191612 A2 | 3/2002 |
| EP | 1191614 A2 | 3/2002 |
| EP | 1215945 A2 | 6/2002 |
| EP | 1227529 A2 | 7/2002 |
| EP | 1277824 A1 | 1/2003 |
| EP | 1394617 A2 | 3/2004 |
| EP | 1586616 A2 | 10/2005 |
| EP | 1933603 A1 | 6/2008 |
| JP | 08167479 A | 6/1996 |
| JP | 11338172 A | 12/1999 |
| JP | 2000068073 A | 3/2000 |
| JP | 2003026641 A | 1/2003 |
| JP | 2003253001 A | 9/2003 |
| JP | 2004014187 A | 1/2004 |
| JP | 2004107292 A | 4/2004 |
| JP | 2004176024 A * | 6/2004 |

(Continued)

OTHER PUBLICATIONS

Machine translation of JP2004-176024. Date of publication: Jun. 24, 2004.*
Machine translation of JP2004-184569. Date of publication: Jul. 2, 2004.*
Chen et al. "Novel Light-Emitting Polymers Containing Donor and Acceptor Architectures" J. Polym. Sci. Part A: Polym. Chem. 2003, 41, 725-731. Year of publication: 2003.*
I. H. Campbell et al., Excitation Transfer Processes in a Phosphor-Doped Poly(P-Phenylene Vinylene) Light-Emitting Diode, Physical Review B, vol. 65:085210-1-085210-8, 2002.
D. F. O'Brien et al., Electrophoresence From a Doped Polymer Light Emitting Diode, Synthetic Metals, vol. 116:379-383, 2001.
G. Gustafsson et al., Flexible Light-Emitting Diodes Made From Soluble Conducting Polymers, Nature, vol. 357:477-479, 1992.
Takakazu Yamamoto, Electrically Conducting and Thermally Stable n-Conjugated Poly (Arylene)S Prepared by Organometallic Processes, Prog. Polym. Sci., vol. 17:1153-1205, 1992.
CRC Handbook of Chemistry and Physics, 81st Edition, 2000 (Book Not Included).

(Continued)

*Primary Examiner* — Jennifer A Chriss
*Assistant Examiner* — Andrew K Bohaty

(57) ABSTRACT

The present invention relates to novel copolymers, compositions comprising novel copolymers, and electronic devices comprising at least one layer containing the copolymer.

10 Claims, 1 Drawing Sheet

FOREIGN PATENT DOCUMENTS

| | | | |
|---|---|---|---|
| JP | 2004184569 A | * | 7/2004 |
| JP | 2005243300 A | | 9/2005 |
| JP | 2006328037 A | | 12/2006 |
| JP | 2007504656 A | | 3/2007 |
| JP | 2007504657 A | | 3/2007 |
| JP | 2007511636 A | | 5/2007 |
| JP | 2008517135 A | | 5/2008 |
| KR | 1020050073233 A | | 7/2005 |
| KR | 100702763 B1 | | 4/2007 |
| KR | 1020070091293 A | | 9/2007 |
| KR | 100765728 B1 | | 10/2007 |
| WO | 9954385 A1 | | 10/1999 |
| WO | 00/53565 A1 | | 9/2000 |
| WO | WO 0055927 A1 | * | 9/2000 |
| WO | 00/70655 A2 | | 11/2000 |
| WO | 0141512 A1 | | 6/2001 |
| WO | 02/02714 A2 | | 1/2002 |
| WO | 02/15645 A1 | | 2/2002 |
| WO | 2004025748 A1 | | 3/2004 |
| WO | 2004041901 A1 | | 5/2004 |
| WO | WO 2004106409 A1 | * | 12/2004 |
| WO | 2005024970 A1 | | 3/2005 |
| WO | 2005049546 A1 | | 6/2005 |
| WO | 2005049548 A1 | | 6/2005 |
| WO | 2005049689 A2 | | 6/2005 |
| WO | 2005052027 A1 | | 6/2005 |
| WO | WO 2005052027 A1 | * | 6/2005 |
| WO | 2005080525 A2 | | 9/2005 |
| WO | WO 2006043087 A1 | * | 4/2006 |
| WO | 2006072002 A2 | | 7/2006 |
| WO | 2006072015 A2 | | 7/2006 |
| WO | 2006086684 A1 | | 8/2006 |
| WO | 2007076146 A2 | | 7/2007 |
| WO | 2007079103 A2 | | 7/2007 |
| WO | 2009067419 A1 | | 5/2009 |

OTHER PUBLICATIONS

I. Colon et al., High Molecular Weight Aromatic Polymers by Nickel Coupling of Aryl Polychlorides, Journal of Polymer Science: Part A:Polymer Chemistry, vol. 28:367-383, 1990.
Byung Doo Chin et al: "Improved blue light-emitting polymeric device by the tuning of drift mobility and charge balance" Applied Physics Letters, vol. 84, No. 10, 2004, pp. 1777-1779, XP002608479.
Extended European Search Report for Application No. EP 06848199; Nov. 5, 2010.
International Preliminary Report on Patentability, The International Bureau of WIPO, Geneva CH, WO 2007/079103; Athina Nickitas-Etiennne, Authorized Officer; Jul. 1, 2008.
PCT International Search Report for International Application No. PCT/US2006/49339, Lee W. Young Authorized Officer, Sep. 24, 2007.
PCT International Search Report for PCT/US 2006/049336; Lee W. Young, Authorized Officer; Sep. 12, 2007.
Supplementary European Search Report, European Patent Office, Munich, DE; WO 2007/079103; Jun. 29, 2009.
Written Opinion of the International Search Authority for Application No. PCT/US2006/049339; WO 2007/079103; Lee W. Young, Authorized Officer; Jun. 25, 2007.
Borello et al., "Photodetectors," Kirk-Othmer Encyclopedia of Chemical Technology, Fourth Edition, 1999, vol. 18, pp. 1537-1538.
Lee et al., "A Thermally Stable Hole Injection Material for Use in Organic Light-Emitting Diodes," Thin Solid Films, 2007, vol. 515, pp. 7726-7731.
Noji et al., "A New Catalytic System for Aerobic Oxidative Coupling of 2-Naphthol Derivatives by the Use of CuCl-Amine Complex: A Practical Synthesis of Binaphthol Derivatives," Tetrahedron Letters, 1994, vol. 35, No. 43, pp. 7983-7984.
Zhao et al., "Solid-State Dye-Sensitized Photovoltaic Device with Newly Designed Small Organic Molecule as Hole-Conductor," Chemical Physical Letters, 2007, vol. 445, pp. 259-264.
Chen et al—Efficient, Blue Light-Emitting Diodes Using Cross-Linked Layers of Polymeric Arylamine and Fluorene, Synthetic Metals 107, 1999 pp. 129-135.
Database Chemical Abstracts—Noguchi, Takanobu et al. Process for Production of High-Molecular Compounds Useful for Polymer LED or the Like. XP002635436, year: 2010.
He et al—High Efficiency—Substrates Feb. 2000; American Institute of Physics, Chem Abstract 132: 229208, Year: 2000.
He et al—High-Efficiency Organic Polymer Light-Emitting Heterostructure Devices on Flexible Plastic Substates, 2000, Applied Physics Letters, vol. 76, No. 6, pp. 661-663.
Nakatsuka et al—Preparation—Electroluminescent Devices, 2001, Mitsui Chemicals Inc., Japan, Chem Abstract 134: 172027.
Nakatsuka et al—Organic—With Long Lifetime, 1999, Mitsui Chemicals Inc., Japan, Chem Abstract 131: 191677.
Qiang Fang et al—New Alternative Copolymer Constituted of Fluorene and Triphenylamine Units With a Tunable-Cho Group in the Side Chain, Macromolecules, vol. 37, 2004, pp. 5894-5899.
Wang—Photoconductive Materials, Kirk-Othmer Encyclopedia of Chemical Technology, Fourth Edition, 1996, vol. 18 pp. 837-860.
Zhu et al—Effect of ITO Carrier—Light Emitting Diodes; 2000; Material Research Society; Chem Abstract 134: 122994.
PCT International Search Report for International Application No. PCT/US2007/018530, C. Meiners Authorized Officer, Feb. 7, 2008.
PCT International Search Report for International Application No. PCT/US2007/018531, D. Marsitzky Authorized Officer, Feb. 26, 2008.
PCT International Search Report for International Application No. PCT/US06/49340, L. Young Authorized Officer, Sep. 11, 2007.
Extended European Search Report for Application No. 06848203.3; 20110520, Year: 2011.

* cited by examiner

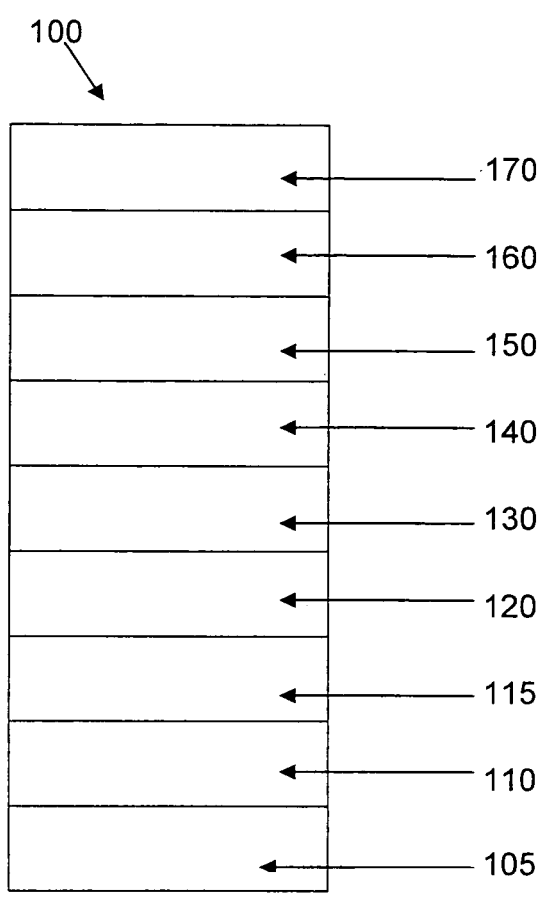

COMPOSITIONS COMPRISING NOVEL COPOLYMERS AND ELECTRONIC DEVICES MADE WITH SUCH COMPOSITIONS

CROSS REFERENCE TO RELATED APPLICATION

This application claims priority under 35 U.S.C. §119(e) from U.S. Provisional Application No. 60/754,962, filed on Dec. 27, 2005, which is incorporated by reference as if fully set forth herein.

BACKGROUND OF THE INVENTION

1. Field of the Invention

The present invention relates to novel copolymers useful as hole transport materials in making electronic devices. The invention further relates to electronic devices having at least one active layer comprising such a hole transport copolymer.

2. Background

In organic photoactive electronic devices, such as organic light emitting diodes ("OLED"), that make up OLED displays, the organic active layer is sandwiched between two electrical contact layers in an OLED display. In an OLED the organic photoactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used.

Devices that use photoactive materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for charge transport materials for use in electronic devices.

SUMMARY OF THE INVENTION

Provided are copolymers having repeating units derived from at least one first monomer selected from the group consisting of A1 to A5

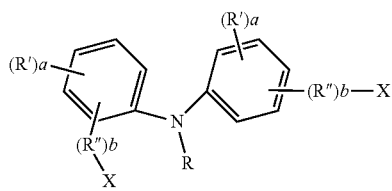

A1

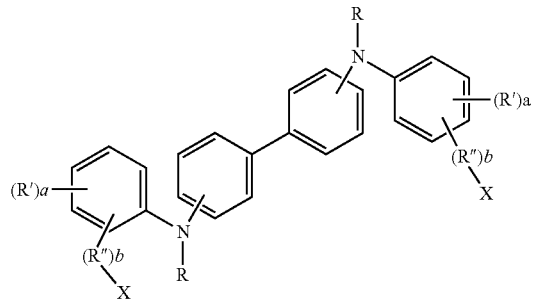

A2

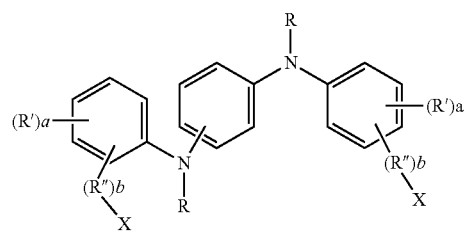

A3

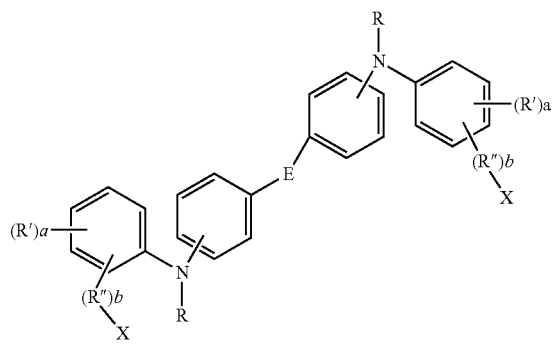

A4

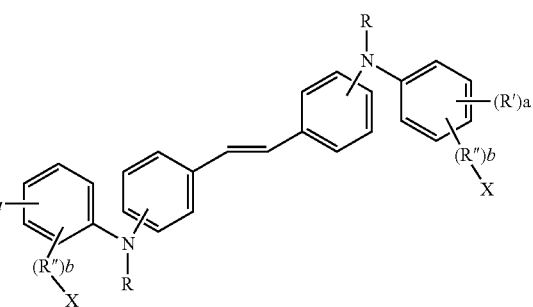

A5 and at least one second monomer selected from the group consisting of A1 to A5, B1 to B7, and C1 to C7,

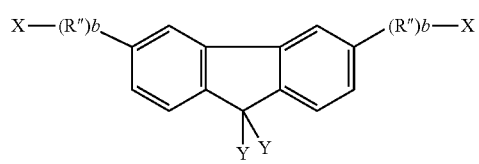

B1

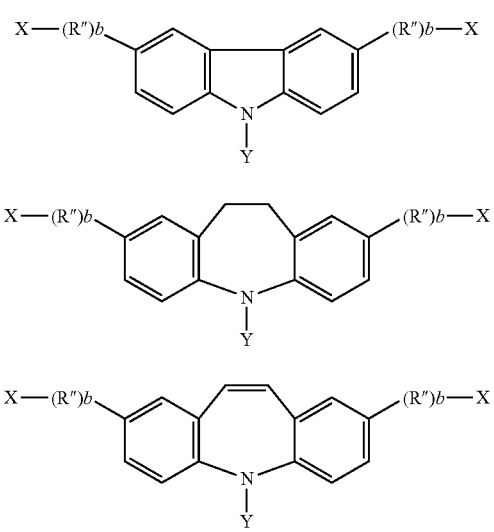
B2
B3
B4
B5
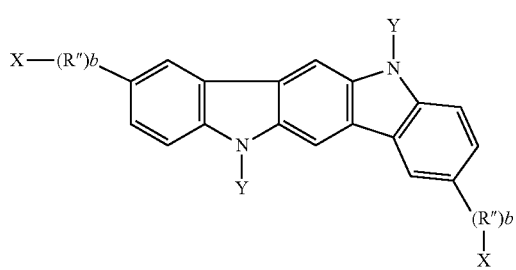
B6
B7
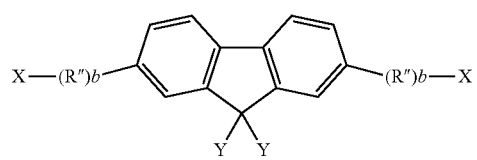
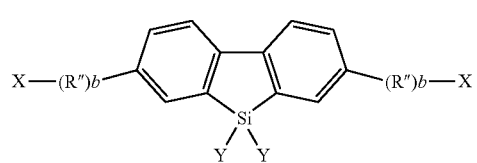
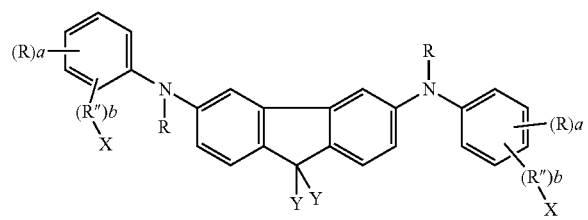
C1
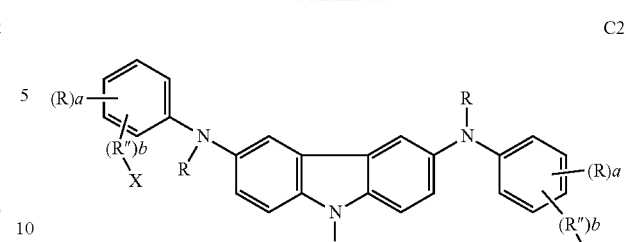
C2
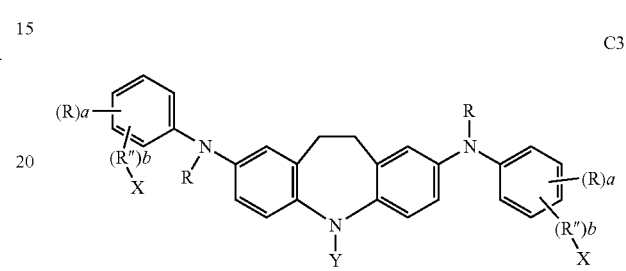
C3
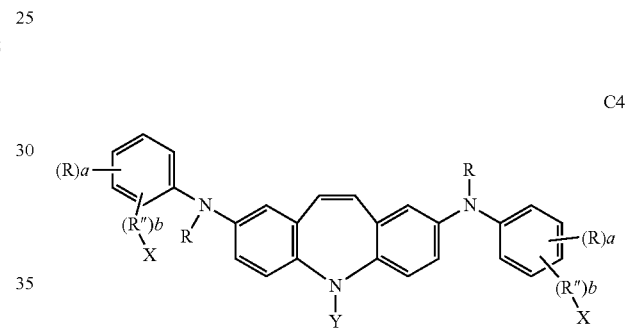
C4
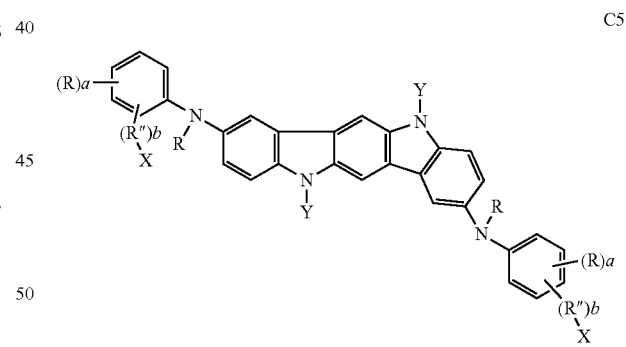
C5
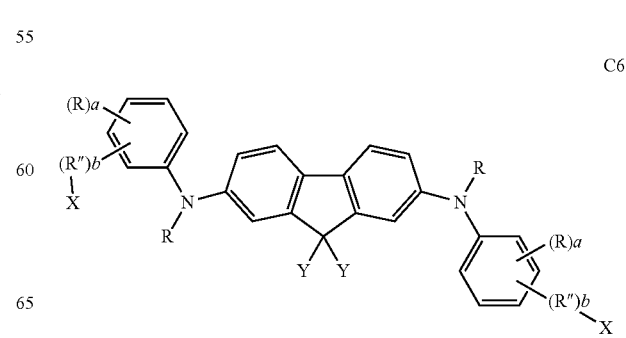
C6

-continued

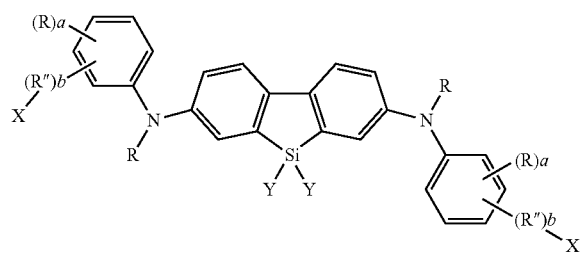

C7 wherein:

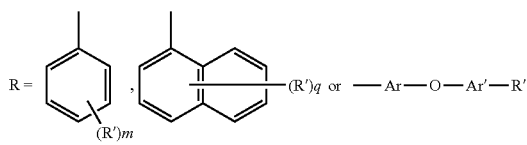

R'=D, alkyl, fluoroalkyl, heteroalkyl, aryl, heteroaryl, alkoxy, fluoroalkoxy, N(R''')$_2$, R'', R''=reactive group R'''=alkyl, fluoroalkyl, aryl Ar, Ar'=independently phenylene, naphthylene, or biphenylene E=O, S, (SiR$^{iv}$R$^v$)$_n$, (CR$^{iv}$R$^v$)$_n$, or combinations thereof, and can be different at each occurrence, wherein R$^{iv}$ and R$^v$ are each independently selected from H, F, alkyl, aryl, alkoxy, aryloxy, fluoroalkyl, fluoroaryl, fluoroalkoxy, and fluoroaryloxy and wherein R$^{iv}$ and R$^v$ can, when taken together, form a non-aromatic ring, X=leaving group Y=alkyl, heteroalkyl, R a=0 to 4 b=0 to 20 m=0 to 5 n=1 to 20 q=0 to 7;

and further wherein the first monomer is different from the second monomer and at least one monomer contains at least one reactive group.

Also provided is a copolymer selected from Copolymers 1-19.

Further provided are electronic devices, each comprising at least one layer comprising the above copolymer or at least one of Copolymers 1-19.

Also further provided is a process for making an organic electronic device comprising:

providing a liquid comprising a copolymer as disclosed herein;

providing an anode;

contacting the liquid comprising the copolymer with the anode;

removing the liquid from the copolymer to produce a hole transport film;

heating to crosslink the copolymer of the hole transport film;

providing an emitter;

disposing the emitter adjacent to the hole transport film;

providing an electron transporter and disposing said electron transporter adjacent to the emitter; and providing a cathode adjacent to the electron transporter.

The foregoing general description and the following detailed description are exemplary and explanatory only and are not restrictive of the invention, as defined in the appended claims.

BRIEF DESCRIPTION OF THE FIGURES

Embodiments are illustrated in the accompanying figures to improve understanding of concepts as presented herein.

FIG. 1: An illustrative example of one organic electronic device comprising at least one layer comprising a novel copolymer as disclosed herein.

Skilled artisans appreciate that objects in the figures are illustrated for simplicity and clarity and have not necessarily been drawn to scale. For example, the dimensions of some of the objects in the figures may be magnified relative to other objects to help to improve understanding of embodiments, and therefore are not necessarily drawn to scale or proportioned to scale.

DETAILED DESCRIPTION

The copolymers disclosed herein are useful in making charge transport layers for use in electronic devices. The charge transport layers can be used in any application wherein charge transport capacity is desired.

The new copolymers described herein have repeating units derived from at least one first monomer selected from the group consisting of monomers A1 through A5, as described above, and at least one second monomer selected from the group consisting of monomers A1 to A5, B1 to B7, and C1 to C7, as described above. In the monomers, all R's and Ar's are independently selected and may be the same or different. R', R''', R$^{iv}$ and R$^v$ can also be a fluoro or hetero analog of any of the groups listed above.

The term "copolymer" is intended to include oligomers and copolymers having two or more different repeating units. Thus, A1 and A2 are different repeating units; to continue the example, two monomers derived from B1 having different substituents would have different repeating units. A copolymer having repeating units derived from a first monomer "X-Q-X" and a second monomer "X-T-X" will have repeating units —(Q)— and —(T)—.

The term "reactive group" is intended to mean a group which remains after polymerization and will react with another like group or another part of the polymer to form crosslinks or networks within the polymer. The formation of crosslinks or networks is hereinafter referred to as a "crosslinking reaction." In one embodiment, the crosslinking reaction is initiated by heat or exposure to visible or UV radiation. In one embodiment, the reactive group is vinyl, acrylate, perfluorovinyl ether, siloxane, or 1-benzo-3,4-cyclobutane.

The term "leaving group" is intended to mean a group that facilitates polymerization and is eliminated in the polymerization reaction. In one embodiment, the leaving group is a halide, triflate, boronic acid, boronic acid ester, or borane. In one embodiment, the leaving group is Cl or Br.

In one embodiment, the first monomer is monomer A1. In one embodiment, the first monomer is A1, wherein a=b=0, and R is 3-vinylphenyl.

In one embodiment, b=0 or 1. In one embodiment, b=0.

In one embodiment, the copolymer is one of Copolymers 1-19 below:
Copolymer 1
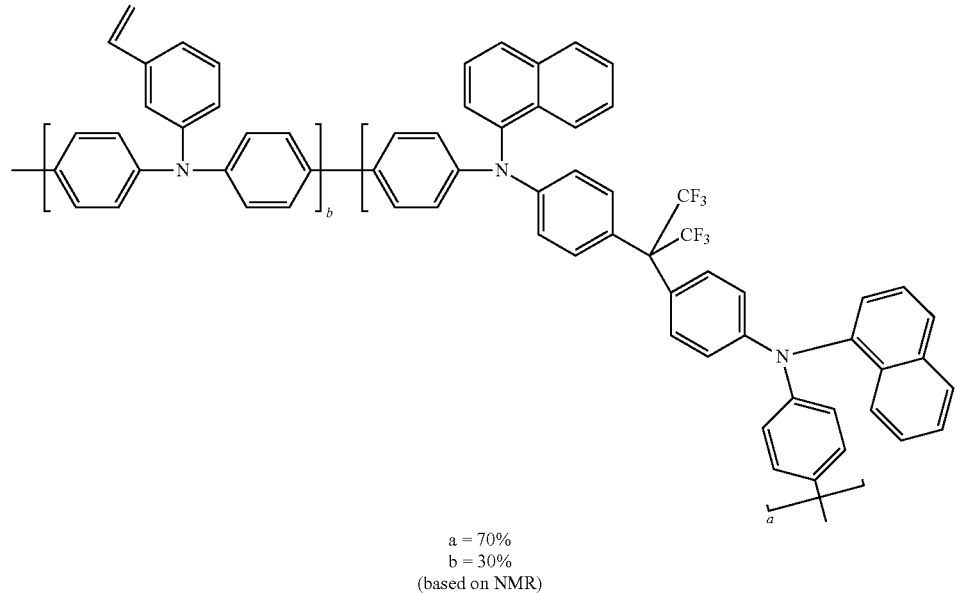
a = 70%
b = 30%
(based on NMR)
Copolymer 2
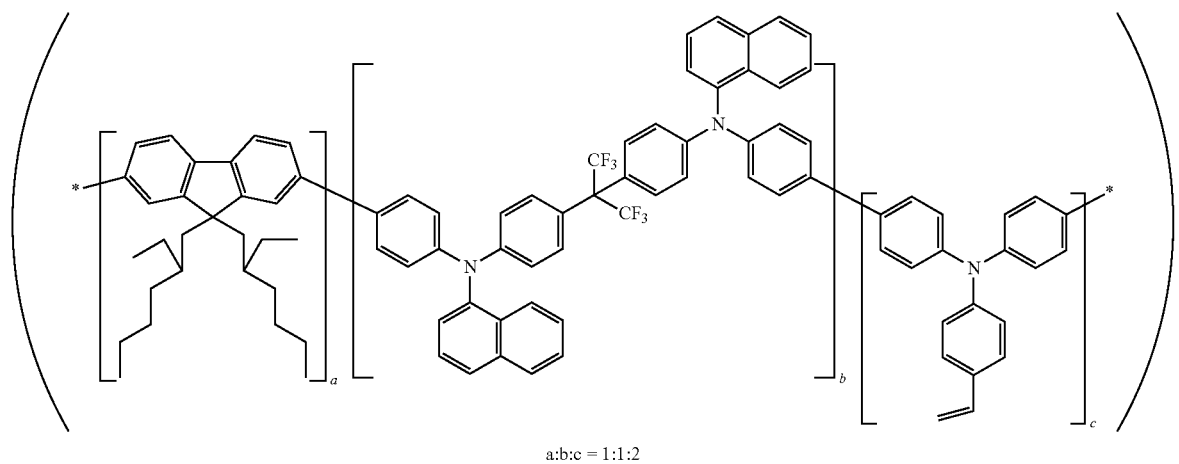
a:b:c = 1:1:2
Copolymer 3
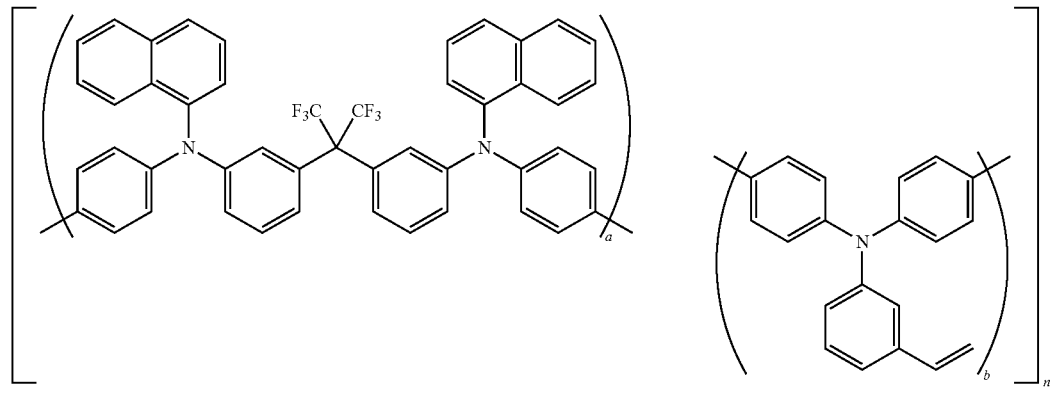
a:b = 2:1

Copolymer 4
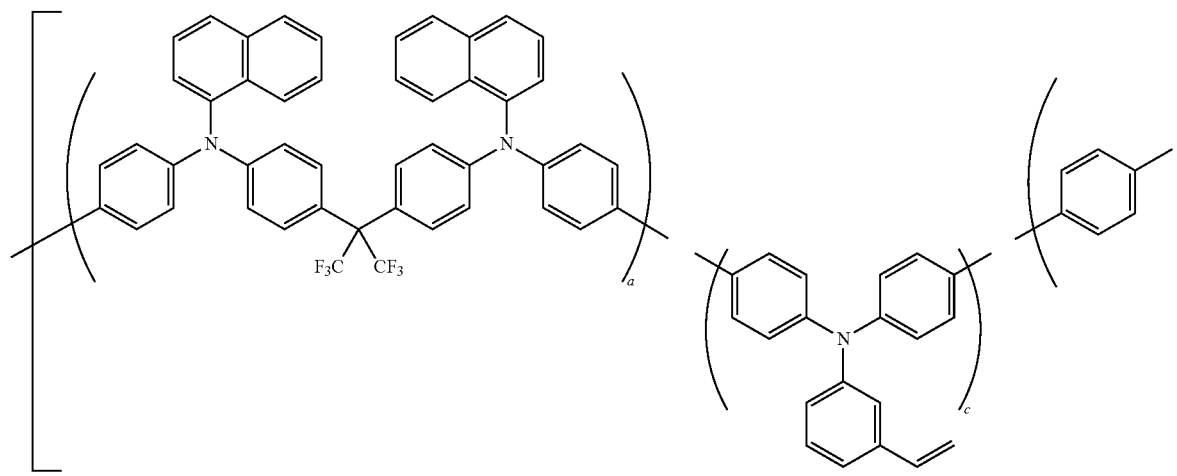
a:b:c = 1:1:1
Copolymer 5
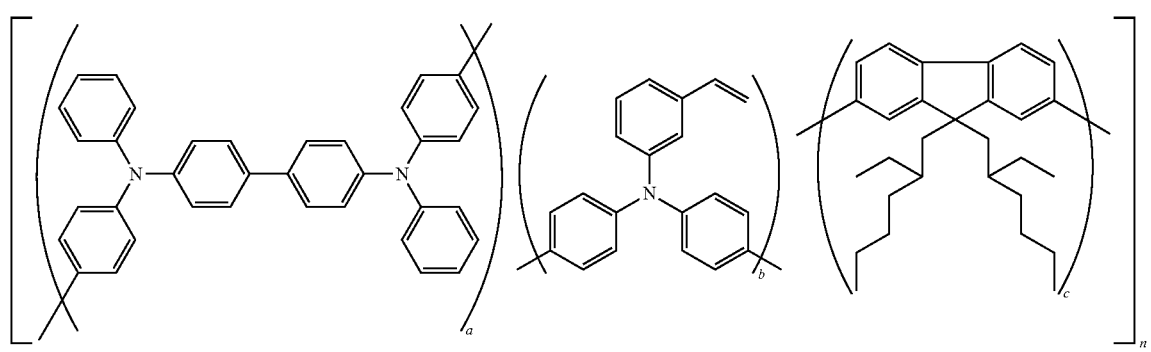
a:b:c = 1:2:2
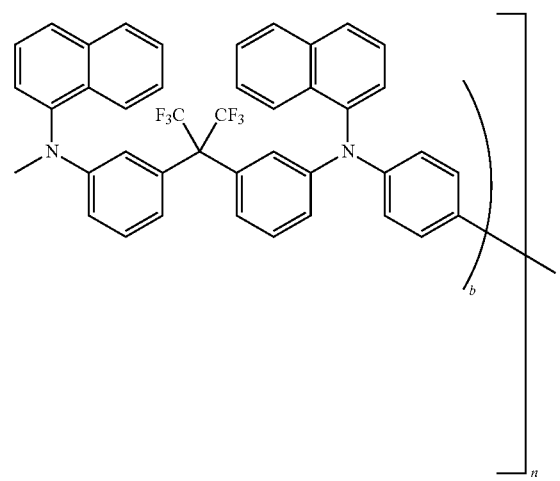

Copolymer 6
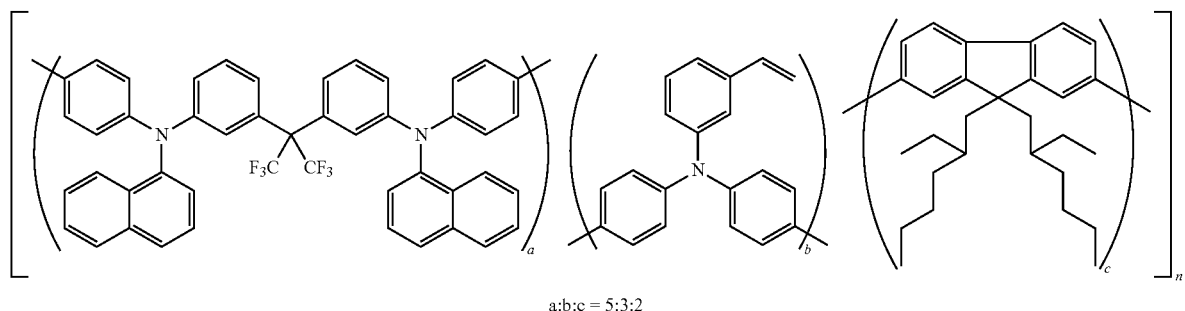
a:b:c = 5:3:2
Copolymer 7
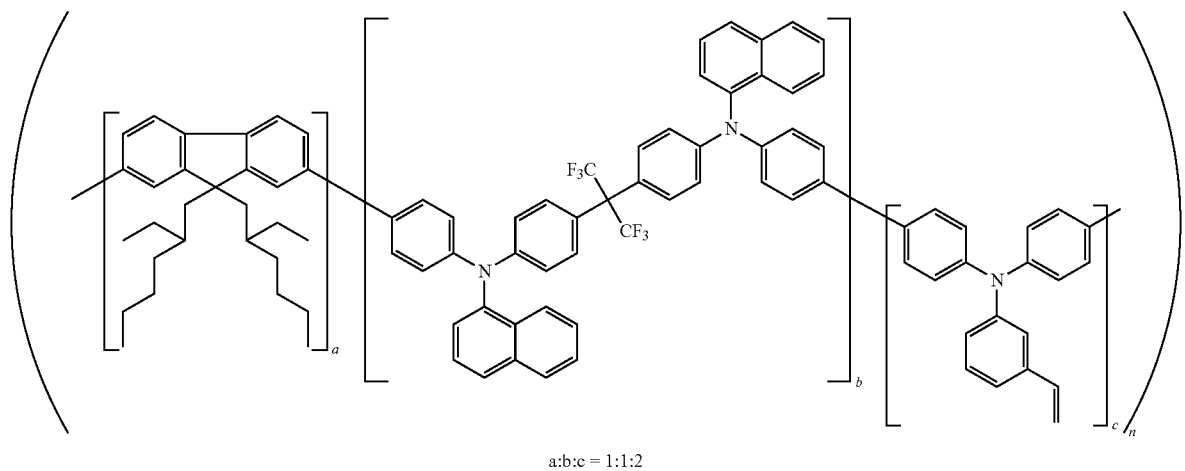
a:b:c = 1:1:2
Copolymer 8
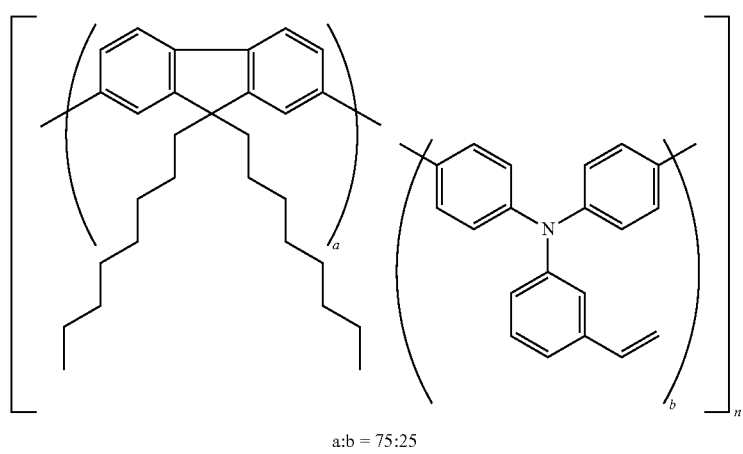
a:b = 75:25

-continued
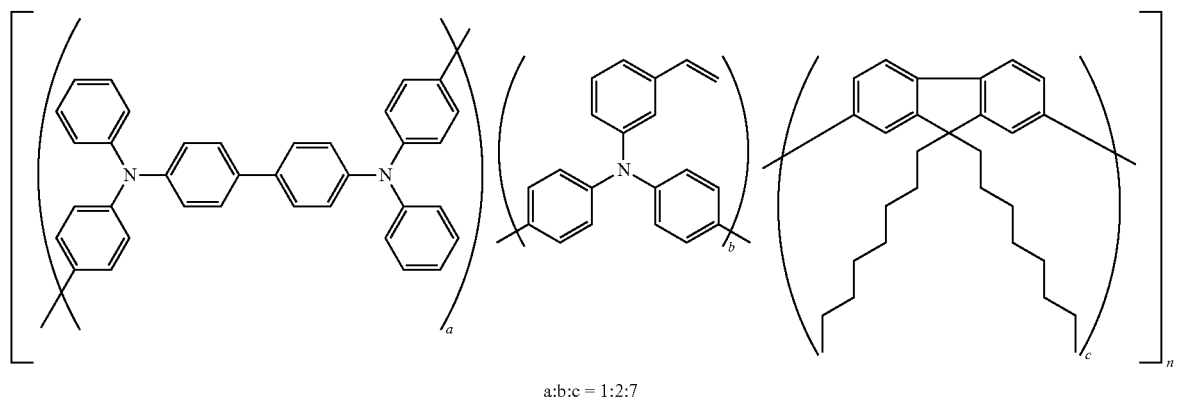
Copolymer 9
a:b:c = 1:2:7
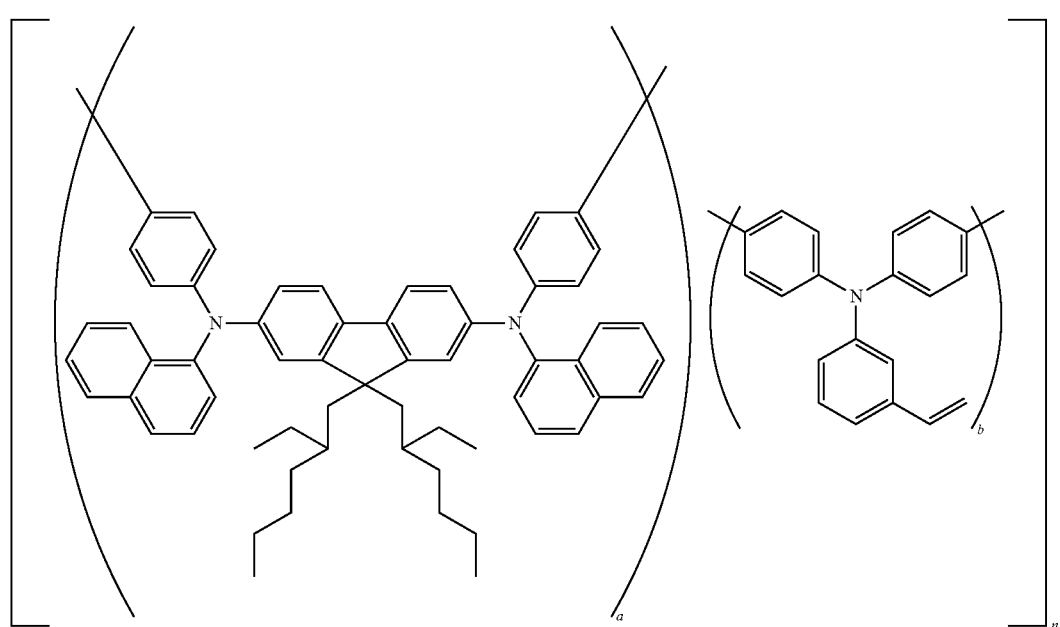
Copolymer 10
a:b = 7:3

Copolymer 11
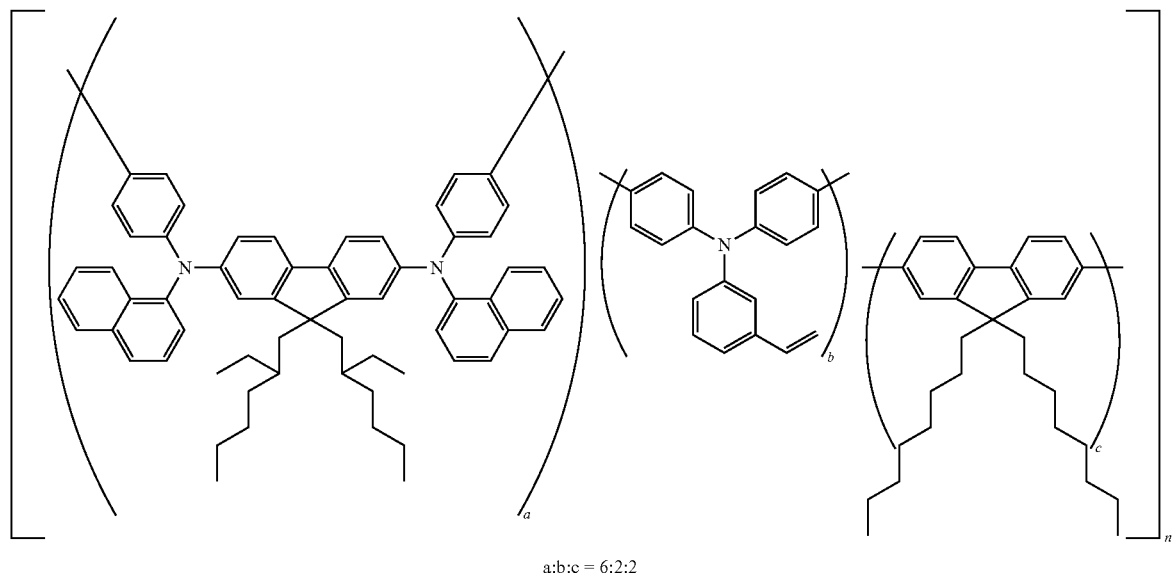
a:b:c = 6:2:2
Copolymer 12
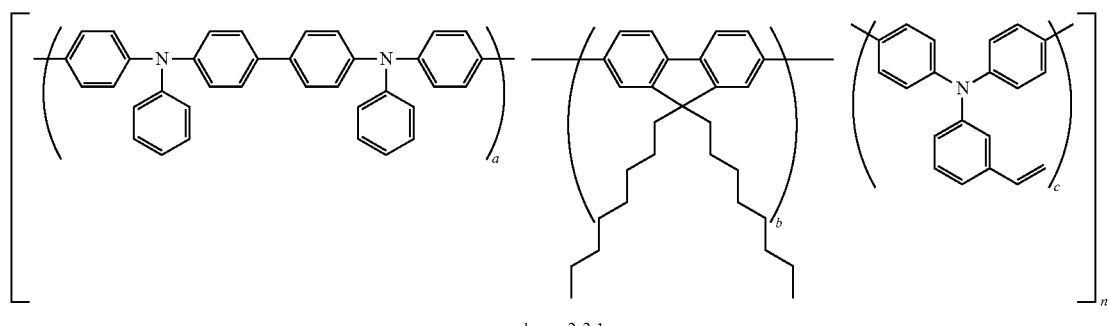
a:b:c = 2:2:1
Copolymer 13
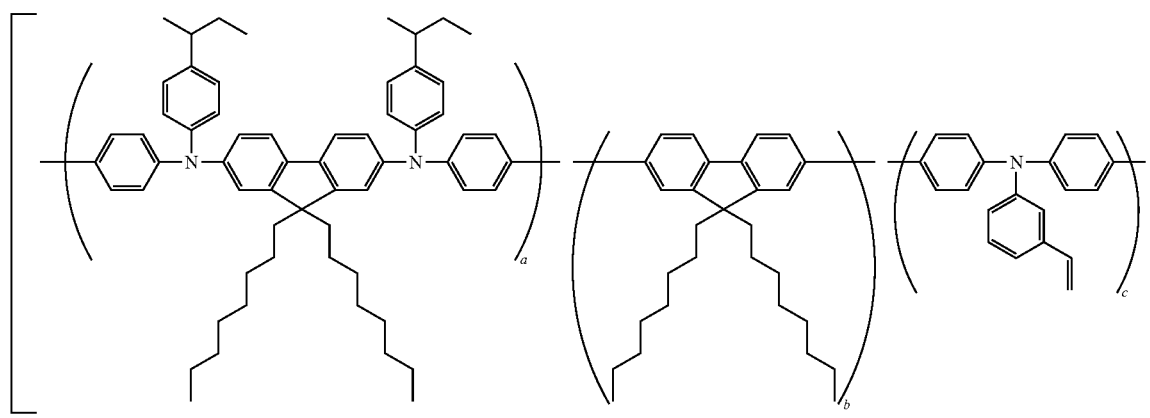

-continued
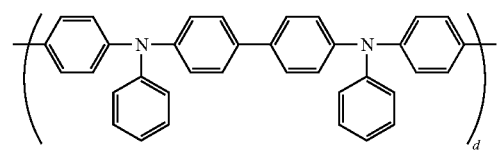
a:b:c:d = 50:10:20:20
Copolymer 14
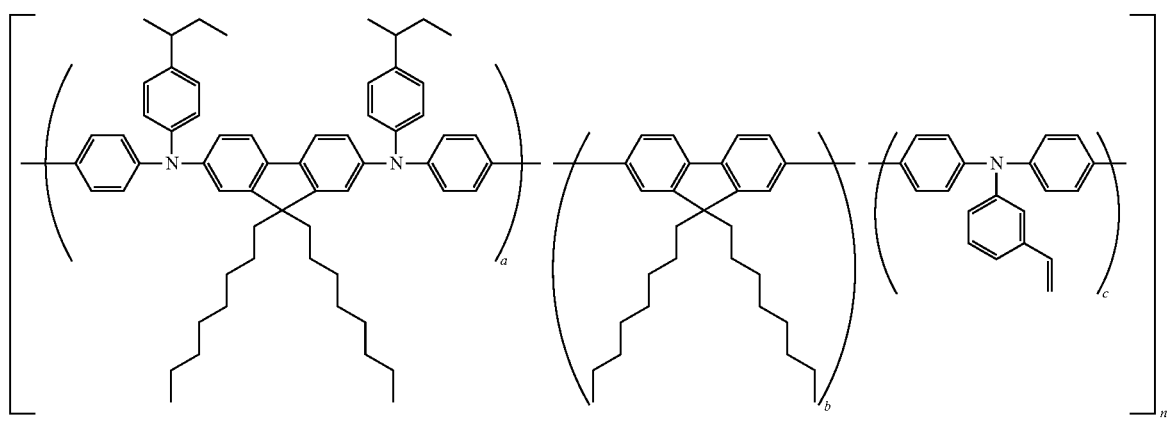
a:b:c = 60:20:20
Copolymer 15
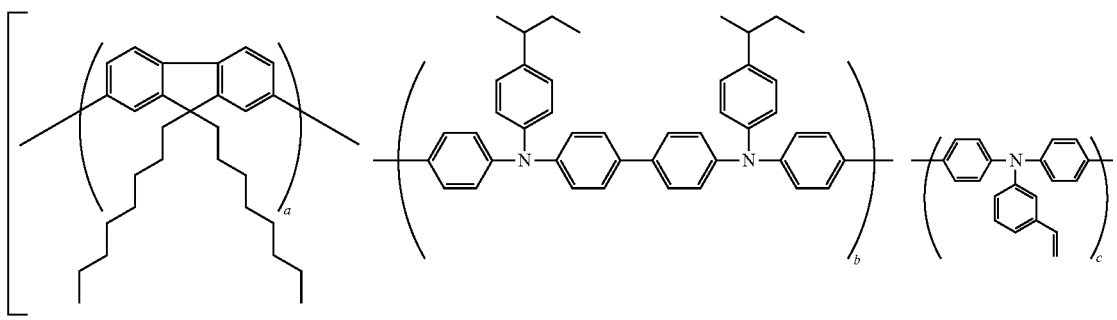
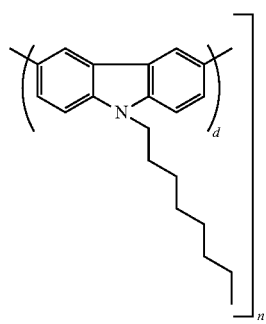
a:b:c:d = 1:2:1:1
Copolymer 16

-continued
Copolymer 16
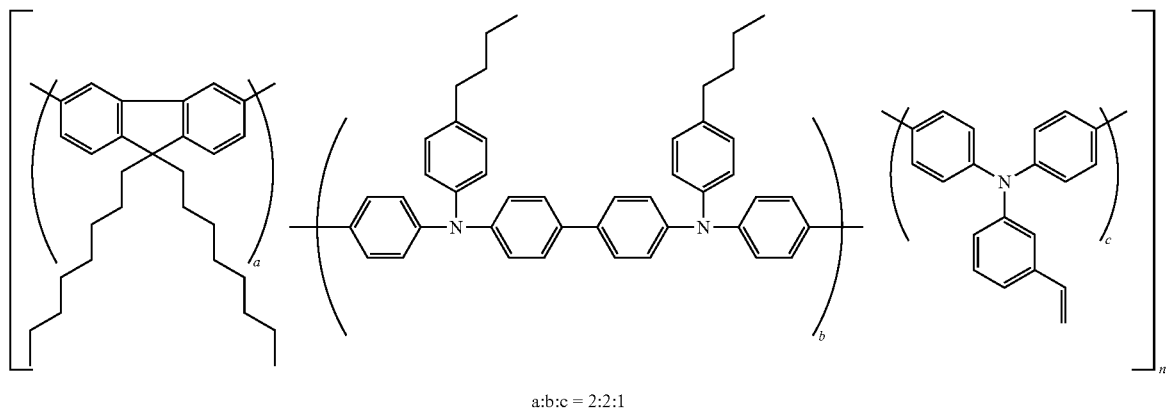
a:b:c = 2:2:1
Copolymer 17
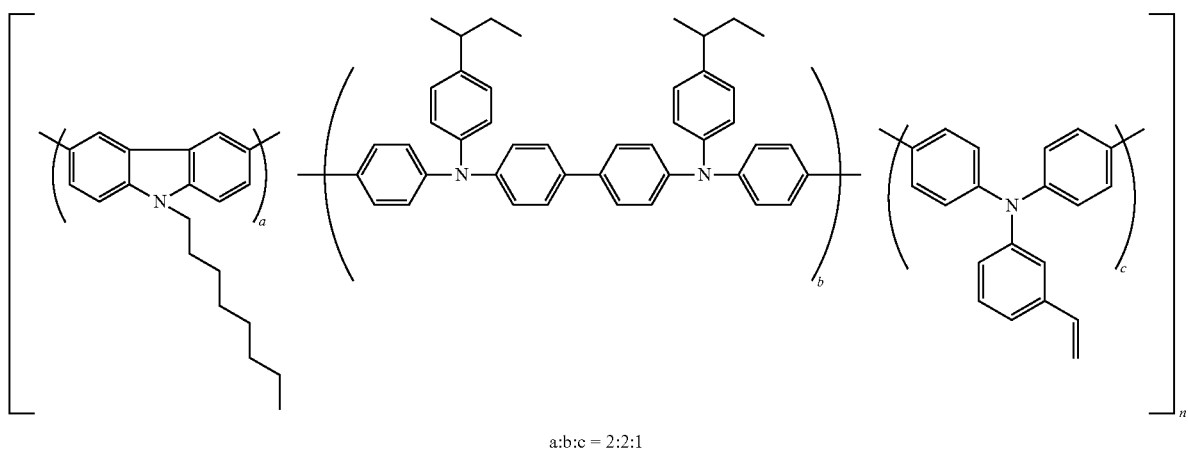
a:b:c = 2:2:1
Copolymer 18
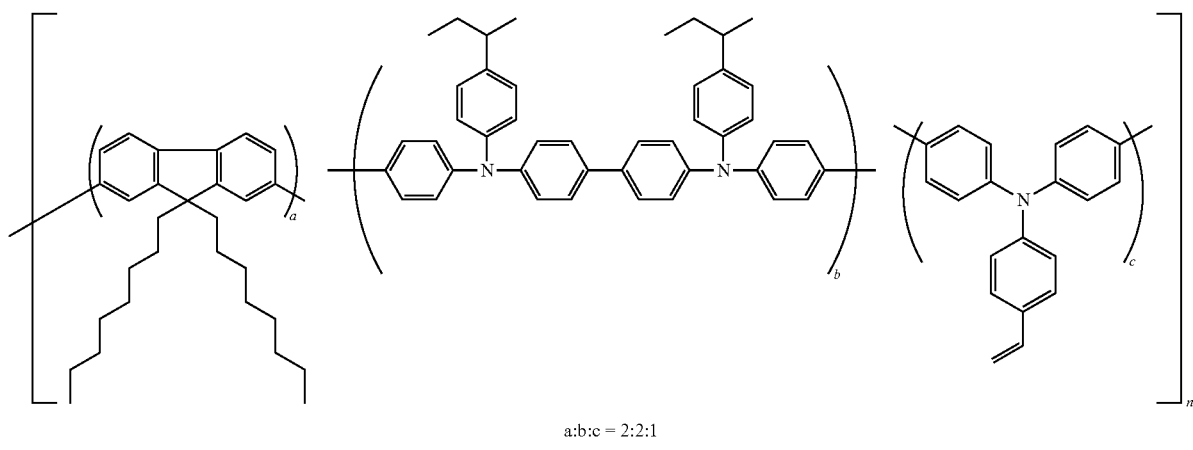
a:b:c = 2:2:1

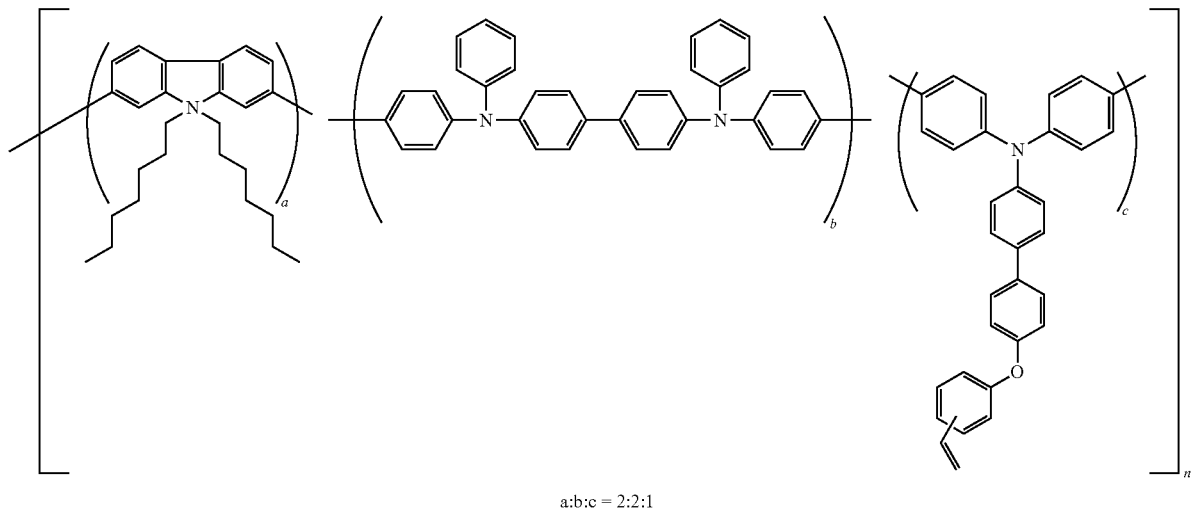

Copolymer 19 a:b:c = 2:2:1

The copolymers described herein can be random or block copolymers. Monomers may be reacted to form larger monomeric units which are then polymerized alone or with other monomers. A copolymer -(A)$_x$-(B)$_y$- may be formed by copolymerizing monomer X-A-X with monomer X—B—X, or by forming larger monomer X-A-B—X and polymerizing that monomer. In both cases, the resulting polymer is considered a copolymer derived from monomer X-A-X and monomer X—B—X.

The copolymers as described herein can generally be prepared by three known synthetic routes. In a first synthetic method, as described in Yamamoto, Progress in Polymer Science, Vol. 17, p 1153 (1992), the dihalo derivatives of the monomeric units are reacted with a stoichiometric amount of a zerovalent nickel compound, such as bis(1,5-cyclooctadiene)nickel(0). In the second method, as described in Colon et al., Journal of Polymer Science, Part A, Polymer chemistry Edition, Vol. 28, p. 367 (1990). The dihalo derivatives of the monomeric units are reacted with catalytic amounts of Ni(II) compounds in the presence of stoichiometric amounts of a material capable of reducing the divalent nickel ion to zerovalent nickel. Suitable materials include zinc, magnesium, calcium and lithium. In the third synthetic method, as described in U.S. Pat. No. 5,962,631, and published PCT application WO 00/53565, a dihalo derivative of one monomeric unit is reacted with a derivative of another monomeric unit having two reactive groups selected from boronic acid, boronic acid esters, and boranes, in the presence of a zerovalent palladium catalyst, such as tetrakis(triphenylphosphine)Pd.

The practical upper limit to the number of monomeric units in the copolymer is determined in part by the desired solubility of a copolymer in a particular solvent or class of solvents. As the number of monomeric units increases, the molecular weight of the compound increases. The increase in molecular weight is generally expected to result in a reduced solubility of the compound in a particular solvent. Moreover, in one embodiment, the number of monomeric units at which a copolymer becomes substantially insoluble in a given solvent is dependent in part upon the structure of the compound. For example, a compound containing multiple phenyl groups may become substantially insoluble in an organic solvent when the number of monomeric units is much less than about $10^4$. As another example, a compound containing fewer phenyl groups and/or phenyl groups with particular functional groups may be soluble in a given solvent even though the number of monomeric units is about $10^4$ or greater, even $10^5$ or $10^6$. The selection of copolymer molecular weight and a solvent is within the purview of one skilled in the art.

In one embodiment, there is provided a liquid composition comprising the new copolymer described above. The liquid composition can be in the form of, for example, a solution, dispersion, or emulsion.

In one embodiment, there is provided a process for making an organic electronic device. The process includes: providing a liquid comprising a new copolymer as described hereinabove; providing an anode; contacting said liquid comprising said compound with said anode; removing said liquid from said compound to produce a hole transport film; heating to crosslink the hole transport copolymer; providing an emitter; disposing said emitter adjacent to said hole transport film; providing an electron transporter and disposing said electron transporter adjacent to said emitter; and providing a cathode adjacent to said electron transporter. The liquid can be, for example, a solution or dispersion. In one embodiment, a buffer layer is provided between the anode and the hole transport film.

The term "organic electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

For making electronic devices, including OLED devices, in one embodiment, the compounds form films when deposited onto a transparent anode such as indium-doped tin oxide (ITO). The quality of the resultant film can be superficially judged by visual/microscopic inspection for smoothness and defect density. With respect to OLEDs, it is preferred that visually observed defects be minimal. Furthermore, film quality can be measured by estimation of film thickness over several separate areas of the film using, for example, an optical ellipsometer or a mechanical profilometer; it is preferred that the films have substantially uniform thicknesses as measured in the different areas of the film.

The liquid is preferably a solvent for the compound. A preferred solvent for a particular compound or related class of compounds can be readily determined by one skilled in the art. For some applications, it is preferred that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics.

Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene, polar solvents (such as tetrahydrofuran (THP), N-methyl pyrrolidone) esters (such as ethylacetate) alcohols (isopropanol), ketones (cyclopentatone) and mixtures thereof.

In one embodiment, the compound is dissolved in a solvent in which the compound is substantially soluble. The solution is then formed into a thin film and dried by any of several techniques such as spin-depositing, inkjetting etc. The resultant film formed as the solvent evaporates is then further dried by baking at elevated temperatures, including above the boiling point of the solvent, either in a vacuum of nitrogen atmosphere. The baking is continued to crosslink the copolymer. The crosslinked copolymer may be substantially less soluble in further liquid processing steps. The film is then subjected to further processing by depositing a second solution containing emissive layer materials on top of the pre-formed compound film where the emissive materials are dissolved in a solvent in which the compound is substantially insoluble. By "substantially insoluble" is meant that less than about 5 mg of the compound dissolves in 1 ml of the solvent. However, solubilities greater than or less than 5 mg can be used and may be preferred for some applications. For example, a modest solubility up to 10mg/mL may result in a blurred or graded interface between the HTM copolymer described herein and the emissive layer materials. Such blurring can have deleterious or beneficial effects depending upon the natures of the materials involved. Such blurring of the interface can result in improved charge transport across the interface and substantially improved device performance or lifetime.

As will be recognized by one skilled in the art, the solubility of a compound is determined in part by substituent groups within the compound. In one embodiment, the compounds have a relatively low solubility, e.g., a solubility less than about 5 mg/mL, even about 2 mg/mL or less, in solvents that can be used to deposit an emissive layer layer film onto an electrode, which is typically a transparent anode such as ITO (indium doped tin oxide).

Device

There are also provided organic electronic devices comprising at least one layer containing a copolymer as disclosed herein, as a hole transport layer. Turning to FIG. 1, an exemplary organic electronic device 100 is shown. The device 100 includes a substrate 105. The substrate 105 may be rigid or flexible, inorganic or organic, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. The anode layer may be deposited as lines, and is an electrode that is effective for injecting positive charge carriers. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8-10 transition metals. If the anode is to be light-transmitting, mixed-metal oxides of Groups 12,13 and 14 metals, such as indium-tin-oxide, are generally used. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

An optional buffer layer 115, comprising materials such as hole transport materials, may be deposited over the anode layer 110, the latter being sometimes referred to as the "hole-injecting contact layer". The buffer layer can comprise hole transport materials. Examples of hole transport materials for layer 115 have been summarized, for example, in Kirk Othmer Encyclopedia of Chemical Technology, Fourth Edition, Vol. 18, p. 837 860, 1996, by Y. Wang. Both hole transporting "small" molecules as well as oligomers and polymers may be used. Hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); 4,4'-N,N'-dicarbazolyl-biphenyl (CBP); and porphyrinic compounds, such as copper phthalocyanine. Useful hole transporting polymers include, but are not limited to, polyvinylcarbazole, (phenylmethyl)polysilane, poythiophene, polypyrrole, and polyaniline. The hole transporting polymer can be a complex of a conducting polymer and a colloid-forming polymeric acid, as disclosed in published US applications US 2004/0254297 and US 2004/029133. Conducting polymers are useful as a class. It is also possible to obtain hole transporting polymers by doping hole transporting moieties, such as those mentioned above, into polymers such as polystyrenes and polycarbonates.

A hole transport layer comprising a copolymer as described herein may be deposited over the buffer layer 115 when present, or over the first electrical contact layer 110.

An organic layer 130 may be deposited over the hole transport layer 120. In some embodiments, the organic layer 130 may be a number of discrete layers comprising a variety of components. Depending upon the application of the device, the organic layer 130 can be a light-emitting layer that is activated by an applied voltage (such as in a light-emitting diode or light-emitting electrochemical cell), or a layer of material that responds to radiant energy and generates a signal with or without an applied bias voltage (such as in a photodetector).

Other layers in the device can be made of any materials which are known to be useful in such layers upon consideration of the function to be served by such layers.

Any organic electroluminescent ("EL") material can be used as a photoactive material, e.g. in layer 130. Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescentemissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to, poly(phenylenevinylenes), polyfluorenes, poly(spirobifluorenes), polythiophenes, poly(p-phenylenes), copolymers thereof, and mixtures thereof.

In one embodiment of the device, photoactive material can be an organometallic complex. In another embodiment, the photoactive material is a cyclometalated complex of iridium or platinum. Other useful photoactive materials may be employed as well. Complexes of iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. (2001), 116 (1-3), 379-383, and Campbell et al., in Phys. Rev. B, Vol. 65 085210.

A second electrical contact layer 160 is deposited on the organic layer 130. For illustrative purposes, the layer 160 is a cathode layer.

Cathode layers may be deposited as lines or as a film. The cathode can be any metal or nonmetal having a lower work function than the anode. Exemplary materials for the cathode can include alkali metals of Group 1, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing and other compounds, such as LiF and $Li_2O$, may also be deposited between an organic layer and the cathode layer to lower the operating voltage of the system.

An electron transport layer 140 or electron injection layer 150 is optionally disposed adjacent to the cathode, the cathode being sometimes referred to as the "electron-injecting contact layer."

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film.

Though not depicted, it is understood that the device 100 may comprise additional layers. For example, there can be an additional layer (not shown) between the anode 110 and hole transport layer 120 to facilitate positive charge transport and/or band-gap matching of the layers, or to function as a protective layer. Other layers that are known in the art or otherwise may be used. In addition, any of the above-described layers may comprise two or more sub-layers or may form a laminar structure. Alternatively, some or all of anode layer 110, the hole transport layer 120, the electron transport layers 140 and 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; optional buffer layer 115 and hole transport layer 120, each 50-2000 Å, in one embodiment 200-1000 Å; photoactive layer 130, 10-2000 Å, in one embodiment 100-1000 Å; layers 140 and 150, each 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In one embodiment, the device has the following structure, in order: anode, buffer layer, hole transport layer, photoactive layer, electron transport layer, electron injection layer, cathode. In one embodiment, the anode is made of indium tin oxide or indium zinc oxide. In one embodiment, the buffer layer comprises a conducting polymer selected from the group consisting of polythiophenes, polyanilines, polypyrroles, copolymers thereof, and mixtures thereof. In one embodiment, the buffer layer comprises a complex of a conducting polymer and a colloid-forming polymeric acid. In one embodiment, the buffer layer comprises a compound having triarylamine or triarylmethane groups. In one embodiment, the buffer layer comprises a material selected from the group consisting of TPD, MPMP, NPB, CBP, and mixtures thereof, as defined above.

In one embodiment, the hole transport layer comprises a new copolymer as described herein.

In one embodiment, the photoactive layer comprises an electroluminescent metal complex and a host material. The host can be a charge transport material. In one embodiment, the host material is an organometallic complex having two or more 8-hydroxyquinolate ligands. In one embodiment, the electroluminescent complex is present in an amount of at least 1% by weight. In one embodiment, the electroluminescent complex is 2-20% by weight. In one embodiment, the electroluminescent complex is 20-50% by weight. In one embodiment, the electroluminescent complex is 50-80% by weight. In one embodiment, the electroluminescent complex is 80-99% by weight. In one embodiment, the metal complex is a cyclometalated complex of iridium, platinum, rhenium, or osmium. In one embodiment, the photoactive layer further comprises a second host material. The second host can be a charge transport material. In one embodiment, the second host is a hole transport material. In one embodiment, the second host is an electron transport material. In one embodiment, the second host material is a metal complex of a hydroxyaryl-N-heterocycle. In one embodiment, the hydroxyaryl-N-heterocycle is unsubstituted or substituted 8-hydroxyquinoline. In one embodiment, the metal is aluminum. In one embodiment, the second host is a material selected from the group consisting of tris(8-hydroxyquinolinato)aluminum, bis(8-hydroxyquinolinato)(4-phenylphenolato)aluminum, tetrakis(8-hydroxyquinolinato)zirconium, and mixtures thereof. The ratio of the first host to the second host can be 1:100 to 100:1. In one embodiment the ratio is from 1:10 to 10:1. In one embodiment, the ratio is from 1:10 to 1:5. In one embodiment, the ratio is from 1:5 to 1:1. In one embodiment, the ratio is from 1:1 to 5:1. In one embodiment, the ratio is from 5:1 to 5:10.

In one embodiment, the electron transport layer comprises a metal complex of a hydroxyaryl-N-heterocycle. In one embodiment, the hydroxyaryl-N-heterocycle is unsubstituted or substituted 8-hydroxyquinoline. In one embodiment, the metal is aluminum. In one embodiment, the electron transport layer comprises a material selected from the group consisting of tris(8-hydroxyquinolinato)aluminum, bis(8-hydroxyquinolinato)(4-phenylphenolato)aluminum, tetrakis(8-hydroxyquinolinato)zirconium, and mixtures thereof. In one embodiment, the electron injection layer is BaO, LiF or $LiO_2$. In one embodiment, the cathode is Al or Ba/Al.

In one embodiment, the device is fabricated by liquid deposition of the buffer layer, the hole transport layer, and the photoactive layer, and by vapor deposition of the electron transport layer, the electron injection layer, and the cathode.

The buffer layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is selected from the group consisting of alcohols, ketones, cyclic ethers, and polyols. In one embodiment, the organic liquid is selected from dimethylacetamide ("DMAc"), N-methylpyrrolidone ("NMP"), dimethylformamide ("DMF"), ethylene glycol ("EG"), aliphatic alcohols, and mixtures thereof. The buffer material can be present in the liquid medium in an amount from 0.5 to 10 percent by weight. Other weight percentages of buffer material may be used depending upon the liquid medium. The buffer layer can be applied by any continuous or discontinuous liquid deposition technique. In one embodiment, the buffer layer is applied by spin coating. In one embodiment, the buffer layer is applied by ink jet printing. After liquid deposition, the liquid medium can be removed in air, in an inert atmosphere, or by vacuum, at room temperature or with heating. In one embodiment, the layer is heated to a temperature less than 275° C. In one embodiment, the heating temperature is between 100° C. and 275° C. In one embodiment, the heating temperature is between 100° C. and 120° C. In one embodiment, the heating temperature is between 120° C. and 140° C. In one embodiment, the heating temperature is between 140° C. and 160° C. In one embodiment, the heating temperature is between 160° C. and 180° C. In one embodiment, the heating temperature is between 180° C. and 200° C. In one embodiment, the heating temperature is between 200° C. and 220° C. In one embodiment, the heating temperature is between 190° C. and 220° C. In one embodiment, the heating temperature is between 220° C. and 240° C. In one embodiment, the heating temperature is between 240° C. and 260° C. In one embodiment, the heating temperature is between 260° C. and 275° C. The heating time is dependent upon the temperature, and is generally between 5 and 60 minutes. In one embodiment, the final layer thickness is between 5 and 200 nm. In one embodiment, the final layer thickness is between 5 and 40 nm. In one embodiment, the final layer thickness is between 40 and 80 nm. In one embodiment, the final layer thickness is between 80 and 120 nm. In one embodiment, the final layer thickness is between 120 and 160 nm. In one embodiment, the final layer thickness is between 160 and 200 nm.

The hole transport layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, xylene, anisole, and mixtures thereof. The hole transport material can be present in the liquid medium in a concentration of 0.2 to 2 percent by weight. Other weight percentages of hole transport material may be used depending upon the liquid medium. The hole transport layer can be applied by any continuous or discontinuous liquid deposition technique. In one embodiment, the hole transport layer is applied by spin coating. In one embodiment, the hole transport layer is applied by ink jet printing. After liquid deposition, the liquid medium can be removed in air, in an inert atmosphere, or by vacuum, at room temperature or with heating. In one embodiment, the layer is heated to a temperature less than 275° C. In one embodiment, the heating temperature is between 170° C. and 275° C. In one embodiment, the heating temperature is between 170° C. and 200° C. In one embodiment, the heating temperature is between 190° C. and 220° C. In one embodiment, the heating temperature is between 210° C. and 240° C. In one embodiment, the heating temperature is between 230° C. and 270° C. The heating time is dependent upon the temperature, and is generally between 5 and 60 minutes. In one embodiment, the final layer thickness is between 5 and 50 nm. In one embodiment, the final layer thickness is between 5 and 15 nm. In one embodiment, the final layer thickness is between 15 and 25 nm. In one embodiment, the final layer thickness is between 25 and 35 nm. In one embodiment, the final layer thickness is between 35 and 50 nm.

The photoactive layer can be deposited from any liquid medium in which it is dissolved or dispersed and from which it will form a film. In one embodiment, the liquid medium consists essentially of one or more organic solvents. In one embodiment, the liquid medium consists essentially of water or water and an organic solvent. In one embodiment the organic solvent is an aromatic solvent. In one embodiment, the organic liquid is selected from chloroform, dichloromethane, toluene, anisole, and mixtures thereof. The photoactive material can be present in the liquid medium in a concentration of 0.2 to 2 percent by weight. Other weight percentages of photoactive material may be used depending upon the liquid medium. The photoactive layer can be applied by any continuous or discontinuous liquid deposition technique. In one embodiment, the photoactive layer is applied by spin coating. In one embodiment, the photoactive layer is applied by ink jet printing. After liquid deposition, the liquid medium can be removed in air, in an inert atmosphere, or by vacuum, at room temperature or with heating. In one embodiment, the deposited layer is heated to a temperature that is less than the Tg of the material having the lowest Tg. In one embodiment, the heating temperature is at least 10° C. less than the lowest Tg. In one embodiment, the heating temperature is at least 20° C. less than the lowest Tg. In one embodiment, the heating temperature is at least 30° C. less than the lowest Tg. In one embodiment, the heating temperature is between 50° C. and 150° C. In one embodiment, the heating temperature is between 50° C. and 75° C. In one embodiment, the heating temperature is between 75° C. and 100° C. In one embodiment, the heating temperature is between 100° C. and 125° C. In one embodiment, the heating temperature is between 125° C. and 150° C. The heating time is dependent upon the temperature, and is generally between 5 and 60 minutes. In one embodiment, the final layer thickness is between 25 and 100 nm. In one embodiment, the final layer thickness is between 25 and 40 nm. In one embodiment, the final layer thickness is between 40 and 65 nm. In one embodiment, the final layer thickness is between 65 and 80 nm. In one embodiment, the final layer thickness is between 80 and 100 nm.

The electron transport layer can be deposited by any vapor deposition method. In one embodiment, it is deposited by thermal evaporation under vacuum. In one embodiment, the final layer thickness is between 1 and 100 nm. In one embodiment, the final layer thickness is between 1 and 15 nm. In one embodiment, the final layer thickness is between 15 and 30 nm. In one embodiment, the final layer thickness is between 30 and 45 nm. In one embodiment, the final layer thickness is between 45 and 60 nm. In one embodiment, the final layer thickness is between 60 and 75 nm. In one embodiment, the final layer thickness is between 75 and 90 nm. In one embodiment, the final layer thickness is between 90 and 100 nm.

The electron injection layer can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 0.1 and 3 nm. In one embodiment, the final layer thickness is between 0.1 and 1 nm. In one embodiment, the final layer thickness is between 1 and 2 nm. In one embodiment, the final layer thickness is between 2 and 3 nm.

The cathode can be deposited by any vapor deposition method. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 10 and 10000 nm. In one embodiment, the final layer thickness is between 10 and 1000 nm. In one embodiment, the final layer thickness is between 10 and 50 nm. In one embodiment, the final layer thickness is between 50 and 100 nm. In one embodiment, the final layer thickness is between 100 and 200 nm. In one embodiment, the final layer thickness is between 200 and 300 nm. In one embodiment, the final layer thickness is between 300 and 400 nm. In one embodiment, the final layer thickness is between 400 and 500 nm. In one embodiment, the final layer thickness is between 500 and 600 nm. In one embodiment, the final layer thickness is between 600 and 700 nm. In one embodiment, the final layer thickness is between 700 and 800 nm. In one embodiment, the final layer thickness is between 800 and 900 nm. In one embodiment, the final layer thickness is between 900 and 1000 nm. In one embodiment, the final layer thickness is between 1000 and 2000 nm. In one embodiment, the final layer thickness is between 2000 and 3000 nm. In one embodiment, the final layer thickness is between 3000 and 4000 nm. In one embodiment, the final layer thickness is between 4000 and 5000 nm. In one embodiment, the final layer thickness is between 5000 and 6000 nm. In one embodiment, the final layer thickness is between 6000 and 7000 nm. In one embodiment, the final layer thickness is between 7000 and 8000 nm. In one embodiment, the final layer thickness is between 8000 and 9000 nm. In one embodiment, the final layer thickness is between 9000 and 10000 nm.

In one embodiment, the device is fabricated by vapor deposition of the buffer layer, the hole transport layer, and the photoactive layer, the electron transport layer, the electron injection layer, and the cathode.

In one embodiment, the buffer layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the hole transport layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^8$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the photoactive layer is applied by vapor deposition. In one embodiment, it is deposited by thermal evaporation under vacuum. In one embodiment, the photoactive layer consists essentially of a single electroluminescent compound, which is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the photoactive layer comprises two electroluminescent materials, each of which is applied by thermal evaporation under vacuum. Any of the above listed vacuum conditions and temperatures can be used. Any of the above listed deposition rates can be used. The relative deposition rates can be from 50:1 to 1:50. In one embodiment, the relative deposition rates are from 1:1 to 1:3. In one embodiment, the relative deposition rates are from 1:3 to 1:5. In one embodiment, the relative deposition rates are from 1:5 to 1:8. In one embodiment, the relative deposition rates are from 1:8 to 1:10. In one embodiment, the relative deposition rates are from 1:10 to 1:20. In one embodiment, the relative deposition rates are from 1:20 to 1:30. In one embodiment, the relative deposition rates are from 1:30 to 1:50. The total thickness of the layer can be the same as that described above for a single-component photoactive layer.

In one embodiment, the photoactive layer comprises one electroluminescent material and at least one host material, each of which is applied by thermal evaporation under vacuum. Any of the above listed vacuum conditions and temperatures can be used. Any of the above listed deposition rates can be used. The relative deposition rate of electroluminescent material to host can be from 1:1 to 1:99. In one embodiment, the relative deposition rates are from 1:1 to 1:3. In one embodiment, the relative deposition rates are from 1:3 to 1:5. In one embodiment, the relative deposition rates are from 1:5 to 1:8. In one embodiment, the relative deposition rates are from 1:8 to 1:10. In one embodiment, the relative deposition rates are from 1:10 to 1:20. In one embodiment, the relative deposition rates are from 1:20 to 1:30. In one embodiment, the relative deposition rates are from 1:30 to 1:40. In one embodiment, the relative deposition rates are from 1:40 to 1:50. In one embodiment, the relative deposition rates are from 1:50 to 1:60. In one embodiment, the relative deposition rates are from 1:60 to 1:70. In one embodiment, the relative deposition rates are from 1:70 to 1:80. In one embodiment, the relative deposition rates are from 1:80 to 1:90. In one embodiment, the relative deposition rates are from 1:90 to 1:99. The total thickness of the layer can be the same as that described above for a single-component photoactive layer.

In one embodiment, the electron transport layer is applied by vapor deposition. In one embodiment, it is deposited by thermal evaporation under vacuum. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the vacuum is less than $10^{-6}$ torr. In one embodiment, the vacuum is less than $10^{-7}$ torr. In one embodiment, the vacuum is less than $10^{-8}$ torr. In one embodiment, the material is heated to a temperature in the range of 100° C. to 400° C. In one embodiment, the material is heated to a temperature in the range of 100° C. to 150° C. In one embodiment, the material is heated to a temperature in the range of 150° C. to 200° C. In one embodiment, the material is heated to a temperature in the range of 200° C. to 250° C. In one embodiment, the material is heated to a temperature in the range of 250° C. to 300° C. In one embodiment, the material is heated to a temperature in the range of 300° C. to 350° C. In one embodiment, the material is heated to a temperature in the range of 350° C. to 400° C. In one embodiment, the material is deposited at a rate of 0.5 to 10 Å/sec. In one embodiment, the material is deposited at a rate of 0.5 to 1 Å/sec. In one embodiment, the material is deposited at a rate of 1 to 2 Å/sec. In one embodiment, the material is deposited at a rate of 2 to 3 Å/sec. In one embodiment, the material is deposited at a rate of 3 to 4 Å/sec. In one embodiment, the material is deposited at a rate of 4 to 5 Å/sec. In one embodiment, the material is deposited at a rate of 5 to 6 Å/sec. In one embodiment, the material is deposited at a rate of 6 to 7 Å/sec. In one embodiment, the material is deposited at a rate of 7 to 8 Å/sec. In one embodiment, the material is deposited at a rate of 8 to 9 Å/sec. In one embodiment, the material is deposited at a rate of 9 to 10 Å/sec. In one embodiment, the final layer thickness is between 5 and 200 nm. In one embodiment, the final layer thickness is between 5 and 30 nm. In one embodiment, the final layer thickness is between 30 and 60 nm. In one embodiment, the final layer thickness is between 60 and 90 nm. In one embodiment, the final layer thickness is between 90 and 120 nm. In one embodiment, the final layer thickness is between 120 and 150 nm. In one embodiment, the final layer thickness is between 150 and 280 nm. In one embodiment, the final layer thickness is between 180 and 200 nm.

In one embodiment, the electron injection layer is applied by vapor deposition, as described above.

In one embodiment, the cathode is applied by vapor deposition, as describe above.

In one embodiment, the device is fabricated by vapor deposition of some of the organic layers, and liquid deposition of some of the organic layers. In one embodiment, the device is fabricated by liquid deposition of the buffer layer, and vapor deposition of all of the other layers.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

The devices can be prepared employing a variety of techniques. These include, by way of non-limiting exemplification, vapor deposition techniques and liquid deposition.

As used herein, the term "hole transport" when referring to a layer, material, member, or structure, is intended to mean such layer, material, member, or structure facilitates migration of positive charges through the thickness of such layer, material, member, or structure with relative efficiency and small loss of charge.

The term "composition", used alone to refer to compositions having particular formulas disclosed and claimed herein, is intended to be construed broadly to include the compounds, monomers, dimers, oligomers and polymers thereof, as well as solutions, dispersions, liquid and solid mixtures and admixtures.

The term "anti-quenching composition" is intended to mean a material which prevents, retards, or diminishes both the transfer of energy and the transfer of an electron to or from the excited state of the photoactive layer to an adjacent layer.

The term "photoactive" refers to any material that exhibits electroluminescence, photoluminescence, and/or photosensitivity.

The term "group" is intended to mean a part of a compound, such as a substituent in an organic compound. The prefix "hetero" indicates that one or more carbon atoms have been replaced with a different atom. The prefix "fluoro" indicates that one or more hydrogens have been replaced with a fluorine.

The term "alkyl" is intended to mean a group derived from an aliphatic hydrocarbon having one point of attachment, which group may be unsubstituted or substituted. In one embodiment, alkyl groups may have 1-20 carbon atoms. The term "aryl" is intended to mean a group derived from an aromatic hydrocarbon having one point of attachment, which group may be unsubstituted or substituted. In one embodiment, the aryl group may have 6-30 carbon atoms. In one embodiment, a heteroaryl group may have 2-30 carbon atoms. The term "alkoxy" is intended to mean the group —OR, where R is alkyl. The term "aryloxy" is intended to mean the group —OR, where R is aryl.

Unless otherwise indicated, all groups can be unsubstituted or substituted. The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

The term "compound" is intended to mean an electrically uncharged substance made up of molecules that further consist of atoms, wherein the atoms cannot be separated by physical means.

The term "copolymer" is intended to encompass oligomeric species and include materials having 2 or more monomeric units. In addition, the IUPAC numbering system is used throughout, where the groups from the Periodic Table are numbered from left to right as 1 through 18 (CRC Handbook of Chemistry and Physics, 81$^{st}$ Edition, 2000).

As used herein, "solution processing" means processes that include depositing from a liquid medium. The liquid medium can be in the form of a solution, a dispersion, an emulsion, or other forms.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, "the", "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Unless otherwise defined, all letter symbols in the figures represent atoms with that atomic abbreviation. Although methods and materials similar or equivalent to those described herein can be used in the practice or testing of the present invention, suitable methods and materials are described below.

All publications, patent applications, patents, and other references mentioned herein are incorporated by reference in their entirety. In case of conflict, the present specification, including definitions, will control. In addition, the materials, methods, and examples are illustrative only and not intended to be limiting.

EXAMPLES

The following examples illustrate certain features and advantages of the present invention. They are intended to be illustrative of the invention, but not limiting. All percentages are by weight, unless otherwise indicated.

Example 1

This example illustrates the synthesis of Copolymer 12:

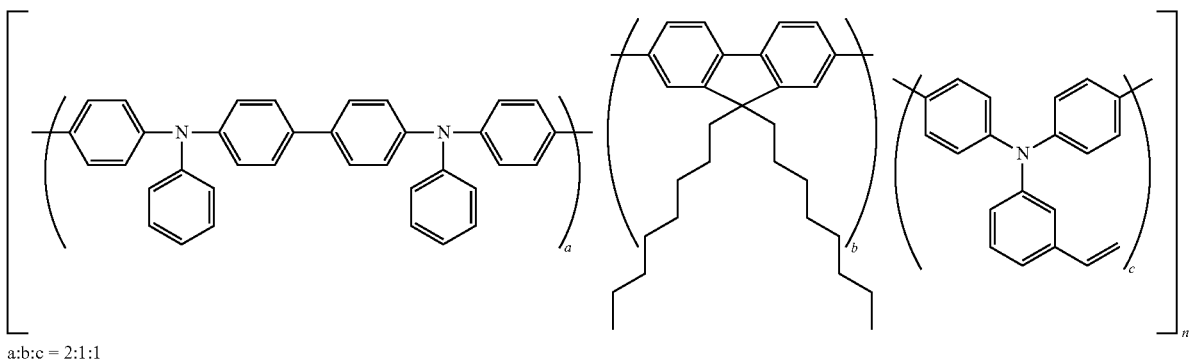

a:b:c = 2:1:1

Bis(1,5-Cyclooctadiene)-nickel-(0) (1.667 g, 6.06 mmol) was added to a N,N-dimethylformamide (anhydrous, 6-mL) solution 2,2'-bipyridyl (0.946 g, 6.06 mmol) and 1,5-cyclooctadiene (0.656 g, 6.06 mmol). The resulting mixture was heated to 60 C for 30 min. A toluene (anhydrous, 25 mL) solution of 9,9-dioctyl-2,7-dibromofluorene (0.658 g, 1.20 mmol), N,N'-Bis(4-bromomphenyl)-N,N'-diphenylbenzidine (0.776g, 1.20 mmol), N,N-Bis(4-chlorophenyl)-3-vinylaniline (0.204 g, 0.60 mmol) was then added rapidly to the stirring catalyst mixture. The mixture was stirred at 60 C for ten hours. After the reaction mixture cooled to room temperature, it was poured, slowly, with vigorous stirring into 500 mL methanol and stirred overnight. Addition of 20 mL of conc. HCl followed and stirring for an hour. The precipitate was filtered and then added to 125 mL of toluene and poured slowly into 1 L of 1:1 methanol:acetone solution which contained 25 mL conc. HCl. The resulting yellow precipitate was stirred for 30 min and then isolated by filtration. The solid was further purified by chromatography (silica, toluene) and precipitation from ethyl acetate. After drying the resulting material under vacuum a light yellow polymer was isolated in 80% yield (0.97 g). GPC (THF, room temperature): Mn=60,616; Mw=365,589; Mw/Mn=5.98.

Note that not all of the activities described above in the general description or the examples are required, that a portion of a specific activity may not be required, and that one or more further activities may be performed in addition to those described. Still further, the order in which activities are listed is not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context-of-separate embodiments, may also be provided in combination in a single embodiment. Conversely, various features that are, for brevity, described in the context of a single embodiment, may also be provided separately or in any subcombination. Further, reference to values stated in ranges include each and every value within that range.

In some embodiments, the invention herein can be construed as excluding any element or process step that does not materially affect the basic and novel characteristics of the composition or process. Additionally, in some embodiments, the invention can be construed as excluding any element or process step not specified herein.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A copolymer having repeating units derived from at least one first monomer selected from the group consisting of A4

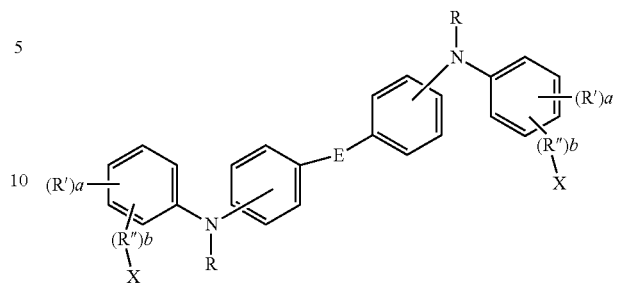

and at least one second monomer selected from the group consisting of A1 to A3, B5, and C5,

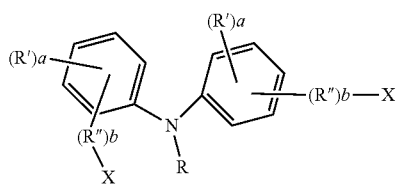

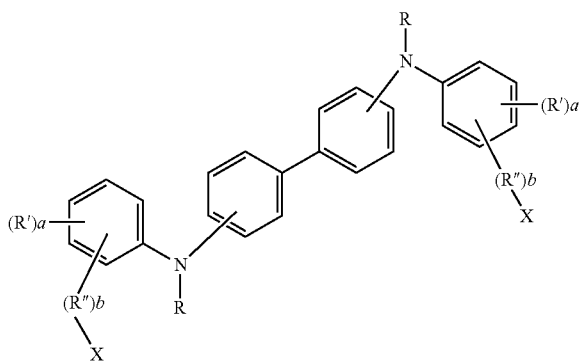

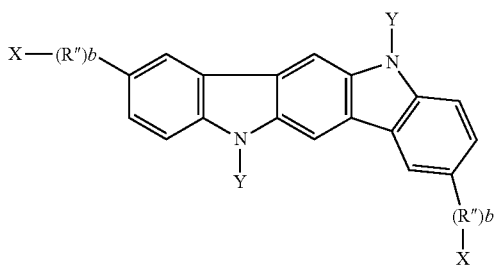

-continued

C5 wherein:

R' = [phenyl with (R')m substitution], [naphthyl with (R')q substitution] or —Ar—O—Ar'—R'

R'=D, alkyl, fluoroalkyl, heteroalkyl, aryl, heteroaryl, alkoxy, fluoroalkoxy, $N(R''')_2$, R", R"=reactive group R'''=alkyl, fluoroalkyl, aryl Ar, Ar'=independently phenylene, naphthylene, or biphenylene $E=(CR^{iv}R^v)_n$, wherein $R^{iv}$ and $R^v$ are each independently selected from H, F, alkyl, aryl, alkoxy, aryloxy, fluoroalkyl, fluoroaryl, fluoroalkoxy, and fluoroaryloxy and wherein $R^{iv}$ and $R^v$ can, when taken together, form a non-aromatic ring, X=leaving group Y=alkyl, heteroalkyl, R a=0 to 4 b=0 to 20 m=0 to 5 n=1 to 20 q=0 to 7;

and further wherein the first monomer is different from the second monomer and at least one monomer contains at least one reactive group.

2. A copolymer of claim 1 wherein b=0 or 1.

3. A copolymer of claim 2 wherein b=0.

4. A copolymer of claim 1 wherein a=b=0.

5. A copolymer of claim 1 wherein R is 3-vinylphenyl.

6. An organic electronic device comprising at least one layer comprising at least one copolymer of claim 1.

7. An organic electronic device of claim 6 wherein the at least one layer is a buffer layer.

8. An organic electronic device of claim 6 wherein the at least one layer is a hole transport layer.

9. An organic electronic device of claim 6 wherein the device has the following structure, in order: anode, buffer layer, hole transport layer, photoactive layer, electron transport layer, electron injection layer, cathode.

10. A copolymer of claim 1, wherein the reactive group is selected from the group consisting of vinyl, acrylate, perfluorovinylether, siloxande, and 1-benzo-3,4-cyclobutane.

* * * * *